(12) United States Patent
Petrmichl

(10) Patent No.: US 6,987,364 B2
(45) Date of Patent: Jan. 17, 2006

(54) FLOATING MODE ION SOURCE

(75) Inventor: Rudolph Hugo Petrmichl, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 10/933,494

(22) Filed: Sep. 3, 2004

(65) Prior Publication Data
US 2005/0082493 A1  Apr. 21, 2005

Related U.S. Application Data

(60) Provisional application No. 60/499,342, filed on Sep. 3, 2003.

(51) Int. Cl.
*H01J 49/10* (2006.01)
(52) U.S. Cl. ............. 315/111.81; 250/423 R; 250/426; 315/111.91; 315/111.01; 313/231.41; 313/231.01
(58) Field of Classification Search ........... 250/423 R, 250/426; 315/111.81, 111.91, 111.01; 313/231.41, 313/231.01
See application file for complete search history.

(56) References Cited

U.S. PATENT DOCUMENTS

| | | | |
|---|---|---|---|
| 5,457,298 A * | 10/1995 | Nelson et al. ......... | 219/121.52 |
| 5,656,819 A | 8/1997 | Greenly | |
| 5,969,470 A * | 10/1999 | Druz et al. ............. | 313/359.1 |
| 6,002,208 A | 12/1999 | Maishev et al. | |
| 6,037,717 A | 3/2000 | Maishev et al. | |
| 6,214,183 B1 * | 4/2001 | Maishev et al. ....... | 204/298.04 |
| 6,359,388 B1 | 3/2002 | Petrmichl | |
| 6,596,399 B2 | 7/2003 | Veerasamy | |
| 6,610,360 B2 | 8/2003 | Petrmichl et al. | |
| RE38,358 E | 12/2003 | Petrmichl | |
| 6,664,739 B1 * | 12/2003 | Kishinevsky et al. ... | 315/111.41 |
| 6,740,211 B2 | 5/2004 | Thomsen et al. | |

OTHER PUBLICATIONS

U.S. Appl. No. 60/499,342 filed Sep. 3, 2003.

* cited by examiner

*Primary Examiner*—Nikita Wells
(74) *Attorney, Agent, or Firm*—Nixon & Vanderhye P.C.

(57) ABSTRACT

A cold-cathode closed-drift ion source includes an anode, a cathode and a power supply. In certain example embodiments, neither the positive nor negative terminals of the power supply are connected to ground, and the anode and cathode are also not connected to ground. Thus, the ion source operates in a floating mode. As a result, the likelihood of formation of a problematic secondary circuit from the source to the power supply through the walls can be reduced and/or eliminated (or suppressed). Therefore, the chance of drawing a net positive charge from the ion source which induces a positive charge on dielectric or other surfaces proximate the wall(s) can be suppressed and/or reduced.

8 Claims, 3 Drawing Sheets

FLOATING MODE ION SOURCE

This application claims priority on U.S. Provisional Application No. 60/499,342, filed Sep. 3, 2003, the entire disclosure of which is hereby incorporated herein by reference.

This invention relates to an ion source for generating an ion beam (diffuse, focused, or collimated), wherein the ion source is operable in a floating mode.

BACKGROUND

An ion source is a device that causes gas molecules to be ionized and then accelerates and emits the ionized gas molecules and/or atoms in a beam toward a substrate. Such an ion beam may be used for various purposes, including but not limited to cleaning a substrate, activation, polishing, etching, and/or deposition of thin film coatings/layer(s). Example ion sources are disclosed, for example, in U.S. Pat. Nos. 6,359,388; 6,037,717; 6,002,208; and 5,656,819, the disclosures of which are all hereby incorporated herein by reference.

FIGS. 1–2 illustrate a conventional cold-cathode type ion source. In particular, FIG. 1 is a side cross-sectional view of an ion beam source with an ion beam emitting slit defined in the cathode, and FIG. 2 is a corresponding sectional plan view along section line II—II of FIG. 1. FIG. 3 is a sectional plan view similar to FIG. 2, for purposes of illustrating that the FIG. 1 ion beam source may have an oval and/or racetrack-shaped ion beam emitting slit as opposed to a circular ion beam emitting slit. Any other suitable shape may also be used. Referring to FIGS. 1–3, the ion source includes a hollow housing made of a magnetoconductive material such as steel, which is used as a cathode 5. Cathode 5 includes cylindrical or oval side wall 7, a closed or partially closed bottom wall 9, and an approximately flat top wall 11 in which a circular or oval ion emitting slit and/or aperture 15 is defined. The bottom 9 and side wall(s) 7 of the cathode are optional. Ion emitting slit/aperture 15 includes an inner periphery as well as an outer periphery. Deposit and/or maintenance gas supply aperture or hole(s) 21 is/are formed in bottom wall 9. Flat top wall 11 functions as an accelerating electrode. A magnetic system including a cylindrical permanent magnet 23 with poles N and S of opposite polarity is placed inside the housing between bottom wall 9 and top wall 11. The N-pole faces flat top wall 11, while the S-pole faces bottom wall 9. The purpose of the magnetic system with a closed magnetic circuit formed by the magnet 23 and cathode 5 is to induce a substantially transverse magnetic field (MF) in an area proximate ion emitting slit 15.

The ion source may be entirely or partially within conductive wall 50. In certain instances, wall 50 may entirely surround the source and substrate 45, while in other instances the wall 50 may only partially surround the ion source and/or substrate.

A circular or oval shaped conductive anode 25, electrically connected to the positive pole of electric power source 29, is arranged so as to at least partially surround magnet 23 and be approximately concentric therewith. Anode 25 may be fixed inside the housing by way of insulative ring 31 (e.g., of ceramic). Anode 25 defines a central opening therein in which magnet 23 is located. The negative pole of electric power source 29 is grounded and connected to cathode 5, so that the cathode is negative with respect to the anode (regardless of which side of zero). Generally speaking, the anode 25 is generally biased positive by several thousand volts. Meanwhile, the cathode (the term "cathode" as used herein includes the inner and/or outer portions thereof) is generally held at ground potential. This is typically the case during all aspects of source operation, including during a mode in which the source is being cleaned.

The conventional ion beam source of FIGS. 1–3 is intended for the formation of a unilaterally directed tubular ion beam, flowing in the direction toward substrate 45. Substrate 45 may or may not be biased in different instances. The ion beam emitted from the area of slit/aperture 15 is in the form of a circle in the FIG. 2 embodiment and in the form of an oval (e.g., race-track) in the FIG. 3 embodiment.

The conventional ion beam source of FIGS. 1–3 operates as follows in a depositing mode when it is desired to ion beam deposit a layer(s) on substrate 45. A vacuum chamber in which the substrate 45 and slit/aperture 15 are located is evacuated, and a depositing gas (e.g., a hydrocarbon gas such as acetylene, or the like) is fed into the interior of the source via aperture(s) 21 or in any other suitable manner. A maintenance gas (e.g., argon) may also be fed into the source in certain instances, along with or in addition to the depositing gas. Power supply 29 is activated and an electric field is generated between anode 25 and cathode 5, which accelerates electrons to high energy. Anode 25 is positively biased by several thousand volts, and cathode 5 is at ground potential as shown in FIG. 1. Electron collisions with the gas in or proximate aperture/slit 15 lead to ionization and a plasma is generated. "Plasma" herein means a cloud or area of gas including ions of a material to be accelerated toward substrate 45.

The plasma expands and fills (or at least partially fills) a region including slit/aperture 15. An electric field is produced in slit 15, oriented in the direction substantially perpendicular to the transverse magnetic field, which causes the ions to propagate toward substrate 45. Electrons in the ion acceleration space in and/or proximate slit/aperture 15 are propelled by the known E×B drift in a closed loop path within the region of crossed electric and magnetic field lines proximate slit/aperture 15. These circulating electrons contribute to ionization of the gas (the term "gas" as used herein means at least one gas), so that the zone of ionizing collisions extends beyond the electrical gap between the anode and cathode and includes the region proximate slit/aperture 15 on one and/or both sides of the cathode 5. For purposes of example, consider the situation where a silane and/or acetylene ($C_2H_2$) depositing gas is/are utilized by the ion source of FIGS. 1–3 in a depositing mode. The silane and/or acetylene depositing gas passes through the gap between anode 25 and cathode 5.

Unfortunately, the conventional cold-cathode ion source of FIG. 1 is problematic in the following respects. Cathode 5, along with the negative terminal of the power supply, and wall 50 are all commonly grounded. Meanwhile, the positive terminal of the power supply is electrically connected to the anode 25. Unfortunately, this common grounding of the cathode 5, wall(s) 50, and power supply allows a secondary unintentional circuit to be created from the anode/cathode part of the source back through the conductive wall(s) 50 to the power supply (the power supply is located outside of wall(s) 50). This is undesirable since a secondary circuit is thus created through wall(s) 50 of the deposition chamber so that net positive charge can be drawn from the source which can induce a positive charge on dielectric surfaces such as a glass substrate, a coating to be coated, any substrate to be coated, or the like, thereby leading to damage.

In view of the above, it will be apparent that there exists a need in the art for a technique for reducing the potential for net positive charge being drawn from the ion source which can induce a problematic positive charge on dielectric surfaces such as a glass substrate or the like, or on other surfaces.

BRIEF SUMMARY OF EXAMPLE EMBODIMENTS OF THE INVENTION

In order to address the aforesaid need, an ion source is provided in a floating mode. In certain example embodiments, both the power supply and the cathode are not grounded. Thus, they are floating with respect to ground. In certain example embodiments, the positive terminal of the power supply is electrically connected to the anode of the ion source and the negative terminal of the power supply is electrically connected to the cathode of the ion source. Since the wall(s) may be grounded, but the cathode and/or power supply are not (they are floating with respect to ground), the likelihood of formation of the aforesaid problematic secondary circuit from the source to the power supply through the walls can be reduced and/or eliminated (or suppressed). Therefore, the chance of drawing a net positive charge from the ion source which induces a positive charge on dielectric surfaces proximate the wall(s) can be suppressed and/or reduced.

DETAILED DESCRIPTION OF EXAMPLE EMBODIMENTS OF INVENTION

Figure 1:
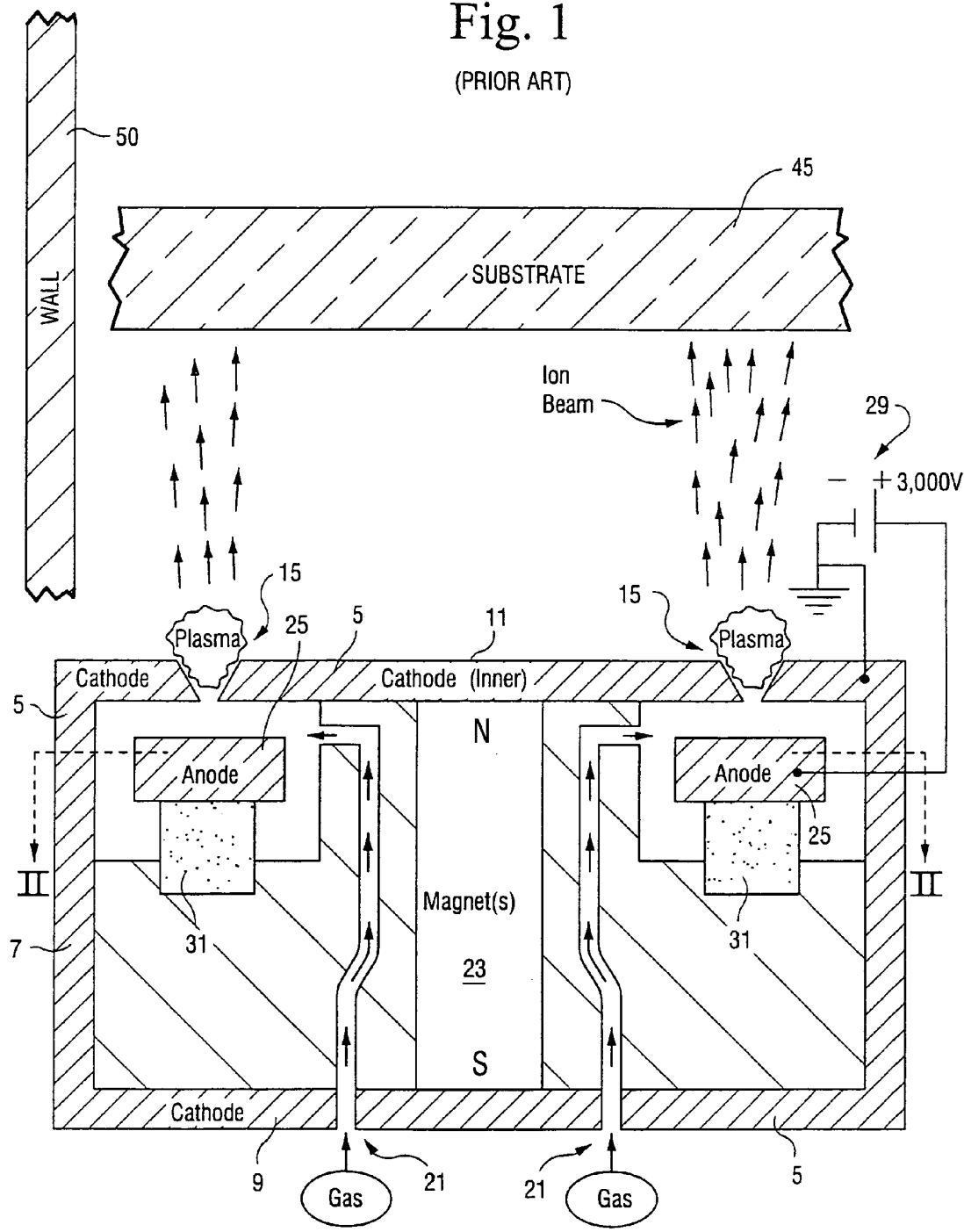
FIGS. 1–3 illustrate a conventional cold cathode ion source.

Referring now more particularly to the accompanying drawings in which like reference numerals indicate like parts throughout the several views.

Figure 2:
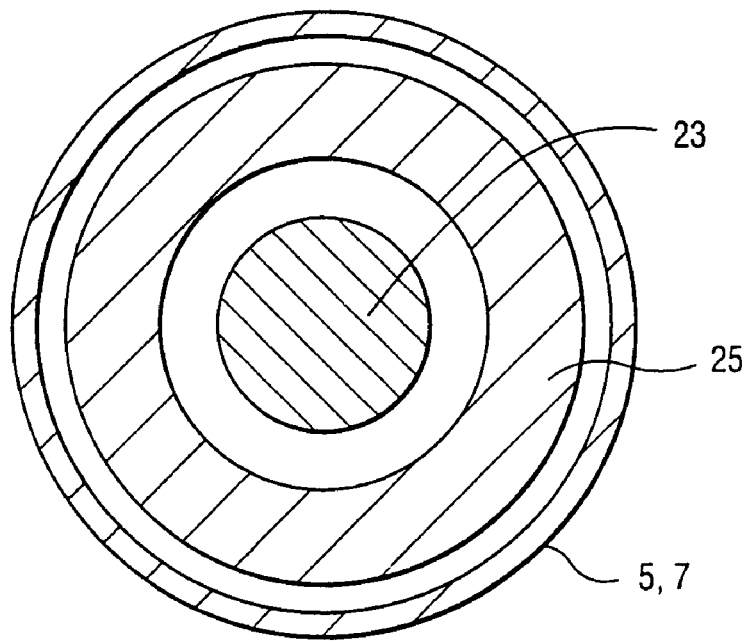
Figure 3:
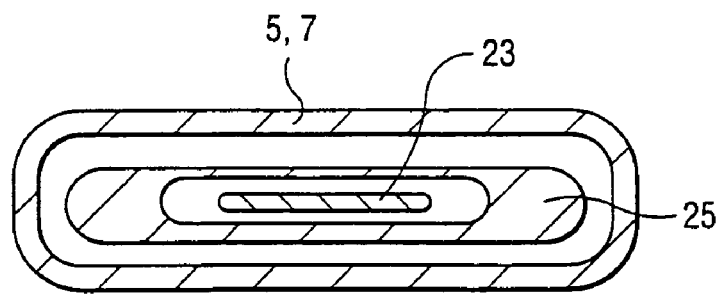
Figure 4:
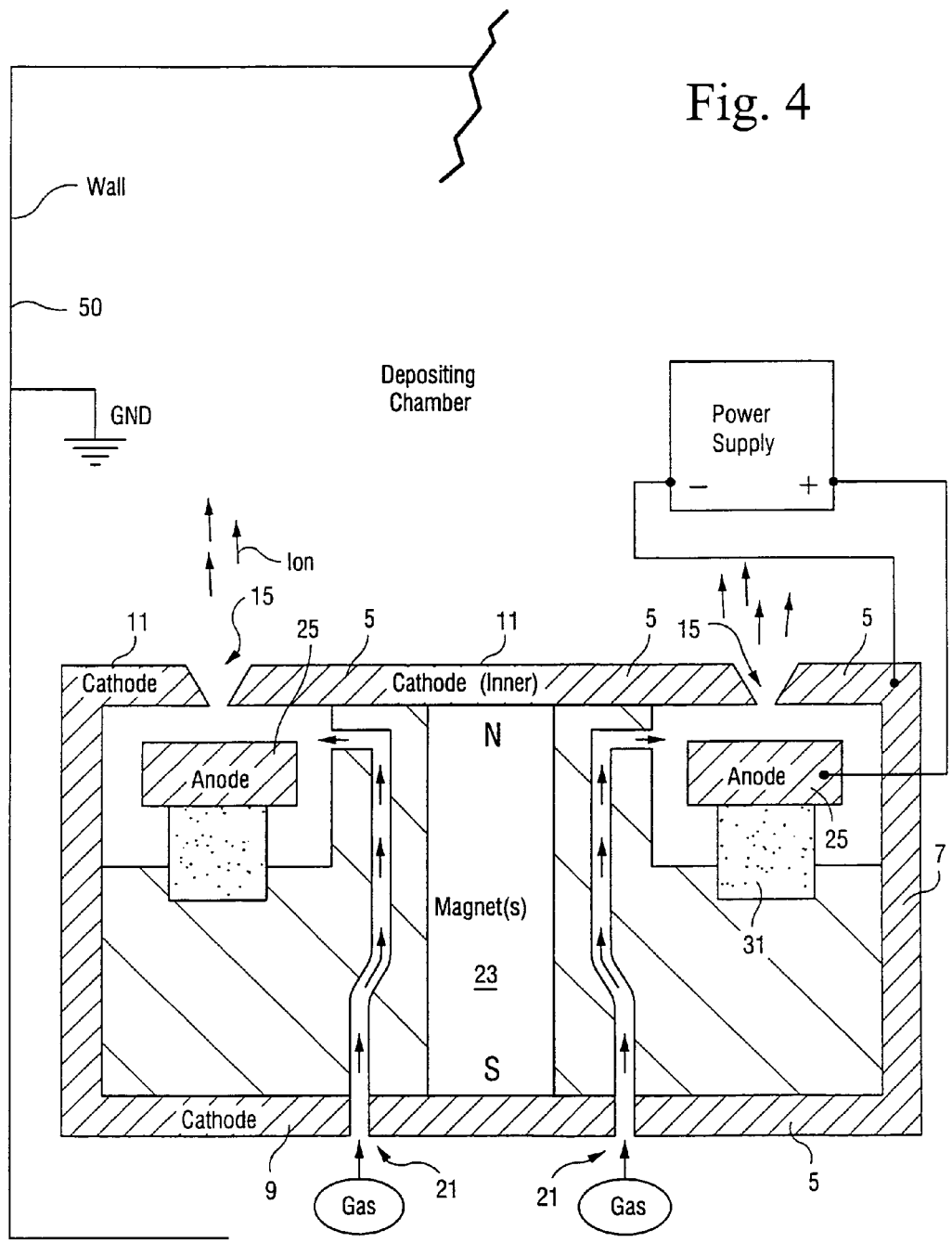
FIG. 4 is a cross sectional view of a cold cathode ion source according to an example embodiment of this invention.

FIG. 4 is a cross sectional view of a cold cathode ion source according to an example embodiment of this invention. FIGS. 2–3 are applicable to FIG. 4, as for example plan views. In order to address the aforesaid need, an ion source is provided in a floating mode. In certain example embodiments, both the power supply and the cathode 5 are not grounded. Thus, they are floating with respect to ground.

In certain example embodiments, the positive terminal of the power supply is electrically connected to the anode 25 of the ion source and the negative terminal of the power supply is electrically connected to the cathode 5 of the ion source. Since the wall(s) 50 may be grounded, but the cathode 5 and power supply are not (they are floating with respect to ground), the likelihood of formation of the aforesaid problematic secondary circuit from the source to the power supply through the walls can be reduced and/or eliminated (or suppressed). Therefore, the chance of drawing a net positive charge from the ion source which induces a positive charge on dielectric surfaces proximate the wall(s) can be suppressed and/or reduced.

This floating mode technique has the advantage relative to a so-called biased mode in that the ion source is decoupled from the chamber walls and thus it is self-neutralized and self-regulating. Consequently, rate does not significantly change as glass or the like moves under/over the beam. This mode requires only one power supply in certain example embodiments.

In certain example embodiments, the potential of surfaces (e.g., dielectric surfaces) formed on the wall(s) may stay proximate zero, which is desirable.

Example advantages associated with the floating mode illustrated in FIG. 4 include one or more of: (a) no or less neutralization sparking at the wall(s) and no intense disruptive neutralization arcing on the cathode face, which may occur after prolonged deposition of dielectric film with un-neutralized beam(s); (b) no or little sensitivity to changing electrical conditions external to the ion source (e.g., instabilities associated with glass-to-be-coated moving under the source in an in-line coater can be reduced or eliminated); (c) elimination or reduction of conductivity induced changes in processing rate (deposition or etch) at the edge of the glass, consequently improving processing uniformity over the entire substrate surface; (d) less possibility of breakdown damage on conductive substrates or conductive films; and/or (e) less or no need for a secondary power supply, substrate voltage sensing device, and/or active feedback control circuit.

The advantages of using a floating mode in the context of a cold-cathode type ion source are differentiated from that in a hot-cathode ion source. In a hot-cathode source, a tungsten cathode emits electrons because it is heated (i.e., the tungsten filament cathode is heated thereby causing it to emit electrons which move toward the anode and through the "gap" thereby creating ions). Unfortunately, hot-cathode type ion sources are problematic in that they cannot be run at high voltages. Thus, high ion energies cannot be used during deposition and/or etching. Thus, the known use of floating in hot-cathode configurations is still undesirable.

In contrast, a cold-cathode type ion source is one where the majority of electrons generated/emitted by the cathode are generated/emitted due to secondary electron emissions (unlike in a hot-cathode type source). In particular, in a cold cathode source, the cathode is not significantly heated to a glowing point. Instead, high voltage can be applied across the anode-cathode, and the cathode is caused to emit electrons due to being bombarded by ions from the gap (i.e., the majority of electrons from the cathode are caused by secondary electron emissions). Cold-cathode type sources are advantageous in that they can utilize high voltages (e.g., permitting deposition of diamond-like carbon such as ta-C:H in certain example instances), have lower gas consumption than do hot-cathode ion sources, large area scalability, and magnetron level uniformity over wide substrates. Thus, cold-cathode sources and their high ion energies may be efficiently used during deposition and/or etching. Unfortunately, cold-cathode type sources suffer from the problems discussed above in the background section. Such problems are solved herein by utilizing the so-called floating mode discussed above.

In view of the above, it will be appreciated that certain embodiments of this invention provide an ion source with a configuration for producing a charge-neutral ion beam from a cold-cathode closed-drift ion source, requiring only one power supply and no control feedback in certain instances. This configuration is realized in a so-called floating mode to distinguished from the standard grounded mode configuration.

An example of the instant invention was made and performed as follows. A neutralization mode example with one floating power supply was used. The positive output of the power supply was connected to the ion source anode and the negative output to the ion source cathode, with neither power supply output connected to ground. Note the following parameters: anode voltage: +898 V; cathode voltage −402 V; Substrate +2 V; Peak thickness 757 Å. The ion source was powered up and the floating potential of the substrate went to about 2 V. This showed that the floating mode is substantially self-neutralizing. It has been observed that even when arcs briefly altered the potential on the ion source electrodes, the floating potential on the substrate remained near 3 volts (V). This demonstrates that the floating mode is self-regulating. Thus, no feedback driven control circuit is required, even though one may be provided in certain instances. In another example, the anode voltage was +1080 V and the cathode voltage was −420 V, and the peak thickness (acetylene gas used to deposit ta-C:H) was 1030 Å. Floating mode neutralization is unexpected and surprising.

In certain example embodiments of this invention, during a majority of, or all of, floating mode operation, the voltage at the substrate is from about −5 to +5V, more preferably from about −3 to +3 V. Moreover, in certain example embodiments of this invention, in terms of absolute value, the voltage applied to the anode is at least 1.5 times higher than that applied to the cathode, more preferably at least 2 times higher.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A cold-cathode ion source comprising:
   an anode, a cathode and a conductive wall(s) at least partially surrounding a deposition chamber;
   a power supply;
   wherein both the power supply and the cathode are not grounded; and
   wherein the conductive wall(s) is grounded.

2. The source of claim 1, wherein a positive terminal of the power supply is electrically connected to the anode and a negative terminal of the power supply is electrically connected to the cathode.

3. A cold-cathode ion source comprising:
   an anode, a cathode, and a conductive wall(s) of the cold-cathode ion source at least partially surrounding a chamber in which a substrate is located;
   a power supply;
   wherein neither the positive nor negative terminal of the power supply is grounded, and thus operates in a floating mode.

4. The source of claim 3, wherein the positive terminal of the power supply is electrically connected to the anode of the ion source, and the negative terminal of the power supply is electrically connected to the cathode.

5. The source of claim 3, wherein the a negative voltage is applied to the cathode and a positive voltage is applied to the anode during operation of the ion source.

6. The source of claim 3, wherein, in terms of absolute value, the voltage applied to the anode is at least 2 times higher than that applied to the cathode.

7. The source of claim 3, wherein in floating mode operation the voltage at the substrate is from −5 to +5 V.

8. The source of claim 3, wherein in floating mode operation the voltage at the substrate is from −3 to +3 V.

* * * * *